United States Patent [19]
Bae

[11] Patent Number: 5,635,336
[45] Date of Patent: Jun. 3, 1997

[54] METHOD FOR THE PREPARATION OF A PATTERN OVERLAY ACCURACY-MEASURING MARK

[75] Inventor: Sang M. Bae, Ichon-kun, Rep. of Korea

[73] Assignee: Hyundai Electronics Industries Co., Ltd., Kyoungki-do, Rep. of Korea

[21] Appl. No.: 654,579

[22] Filed: May 29, 1996

Related U.S. Application Data

[63] Continuation of Ser. No. 321,448, Oct. 12, 1994.

[30] Foreign Application Priority Data

Oct. 15, 1993 [KR] Rep. of Korea .................. 93-21405

[51] Int. Cl.$^6$ .................. G03C 5/00; G03F 7/36
[52] U.S. Cl. .................. 430/314; 430/316; 430/317; 430/22; 438/975; 438/703
[58] Field of Search .................. 430/314, 316, 430/317, 327, 22; 437/924; 156/625, 657, 659.1, 662, 664

[56] References Cited

U.S. PATENT DOCUMENTS

| | | | |
|---|---|---|---|
| 4,992,394 | 2/1991 | Kostelak, Jr. et al. | 437/924 |
| 5,128,280 | 7/1992 | Matsumoto et al. | 437/924 |

*Primary Examiner*—Christopher G. Young
*Attorney, Agent, or Firm*—Gary M. Nath; Nath & Associates

[57] ABSTRACT

Method for the preparation of pattern overlay accuracy-measuring mark consisting of an inner box and an outer box. The method is characterized in that a groove is formed along the inside boundary line of the outer box, so as to enlarge step thereat. The enlarged step prevents inaccuracy in defining the boundary line, of the outer box whose inaccuracy is mainly attributed to smooth flow which occurs at the boundary line as a metal layer is coated over the outer box. Accordingly, the method can easily define the boundary line and thus, definitely measure the overlay accuracy.

6 Claims, 4 Drawing Sheets

METHOD FOR THE PREPARATION OF A PATTERN OVERLAY ACCURACY-MEASURING MARK

This application is a continuation application of U.S. patent application Ser. No. 08/321,448, filed Oct. 12, 1994, the entire contents of which are hereby incorporated in their entirety.

BACKGROUND OF THE INVENTION

1. Field of the Invention

The present invention relates, in general, to a method for preparing a pattern overlay accuracy-measuring mark useful in the fabrication of semiconductor devices particularly, an improvement in measurement of overlay accuracy.

2. Description of Prior Art

Generally, a semiconductor device is fabricated by complicated processes wherein a plurality of light-exposure masks are repeatedly aligned by a stepper. The stepper, which is a limited light-exposing apparatus operable in a step-and-repeat manner repeatedly moves a stage in an x-y direction so as to align the masks prior to exposure to light. By means of the stepper, a wafer is aligned in a manual or automatic manner on the basis of an alignment mark. At the moment, an error may be generated by mechanical motion of the stage during alignment. If this alignment error exceeds an allowable limit, a defect may be generated in the semiconductor device.

Usually, an overlay accuracy-measuring mark, involving an upper mark which is overlapped with a lower mark, measures alignment error. The control range of overlay accuracy for misalignment acts on the design rule of the semiconductor device and is typically in a range of 20 to 30%.

Although the alignment mark relies upon layer-to-layer alignment between different light-exposure masks, it is really used for the alignment between dies with respect to one light-exposure mask. The alignment mark is detected by the recognizer of the stepper in advance of a light-exposing step, which is necessary to revise the overlay accuracy between two patterns thus formed, the accuracy of which has been measured by additional measuring equipment. The term "die" used herein means the total region that is formed by one light-exposing process, and one die may include a plurality of semiconductor devices.

The alignment mark and the overlay accuracy-measuring mark are formed on a scribe line, which can be a portion of wafer where no semiconductor chip is mounted. One methods for measuring the degree of misalignment with the measuring mark, involves either visual checking using a vernier-measuring mark, or automatic checking using a box-in-box or bar-in-bar measuring mark.

In order to better understand the background of the invention, a description is given for the conventional box-in-box measuring mark with reference to some drawings.

Referring to FIG. 1, a scribe line 1 is shown which comprises an outer box 3 and an inner box 4. The outer box 3 is formed by removing a lower film on the scribe line typically measuring 20×20 µm² whereas the inner box 4 is formed by leaving an upper film at the central portion of the outer box typically measuring of 10×10 µm².

FIG. 2 shows cross sectional view taken generally through line II—II of FIG. 1. As shown in this figure, a plurality of layers is deposited over the scribe line of a wafer 11. A first layer 12 is formed on the wafer 11, followed by deposition of a second layer 13 thereon. The second layer 13 is then patterned by photo etching, that portion of the second layer 13 over the scribe line is removed to form the outer box shown in FIG. 1. The inner box is formed by affixing a third layer 14, the central portion of which is covered with a photosensitive pattern 15. The photosensitive pattern serves as a mask when the third layer is photoetched.

The overlay accuracy measuring mark method also includes gauging distances between the sides of the outer box and the inner box, comparing the distances from one another, and revising the misalignment of the X-Y axes of stage. Therefore, it is obvious that the boundary lines of the boxes must be accurately defined for maximum overlay accuracy. The boundary lines are usually determined by irradiating a light and sensing the reflected light.

However, the conventional methods have difficulty in practice. For example, assuming that the second layer 13 is formed with a relatively thin polysilicon film or insulating film and the third layer 14 is a metal layer composed of tungsten or Al—Cu—Si alloy, when the metal layer is deposited, smoothly curved flow occurs at the edge portions of the outer box, restraining accurate definition of the boundary line therein. In addition, since the component metals of Al—Cu—Si alloy are different in grain size, the boundary line of the outer box may be definitely determined or may zigzag along the box.

In an effort to overcome the difficulty of defining the boundary line, a measurement is made after the metal layer is deposited over the etched outer box. However, production of the measuring mark is complicated, and any small defect in the etching step lowers reliability of the resulting semiconductor device.

SUMMARY OF THE INVENTION

Therefore, it is an object of the present invention to overcome the above problems encountered in the prior art methods of this type, and to provide a method for the preparation of a pattern overlay accuracy-measuring mark while preventing inaccuracy in defining the boundary line of the outer box.

The objects could be accomplished by providing a method for the preparation of a pattern overlay accuracy-measuring mark, wherein a groove is formed at the inside boundary line of the outer box.

BRIEF DESCRIPTION OF THE DRAWINGS

The above object and other advantages of the present invention will become more apparent by describing in detail the preferred embodiment of the present invention with reference to the attacked drawings in which.

DETAILED DESCRIPTION OF PREFERRED EMBODIMENTS

Figure 1:
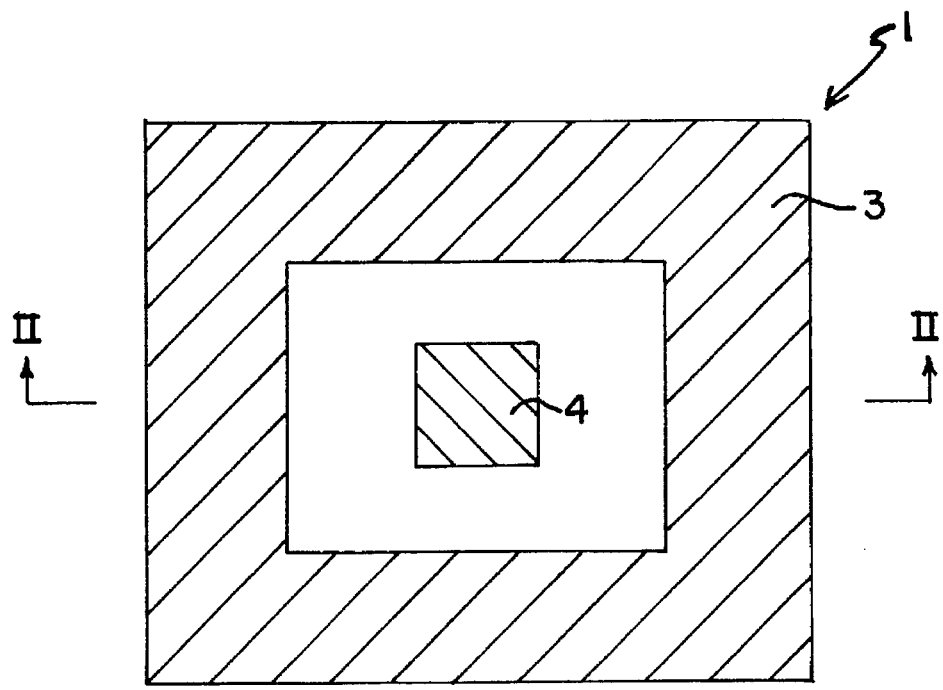
FIG. 1 is a layout of an overlay accuracy-measuring mark according to a conventional method.
Figure 2:
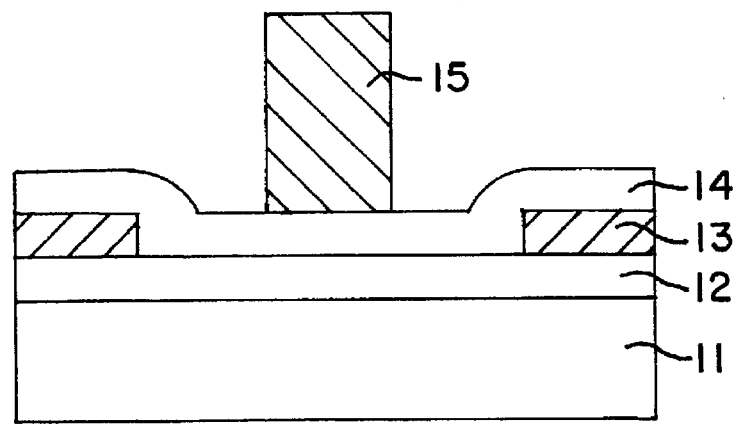
FIG. 2 is a schematic, cross sectional view taken generally through line II—II of FIG. 1.

The preferred embodiments of the present invention are best understood by referring to the accompanying drawings, wherein like reference numerals are used for like and corresponding parts, respectively.

Figure 3:
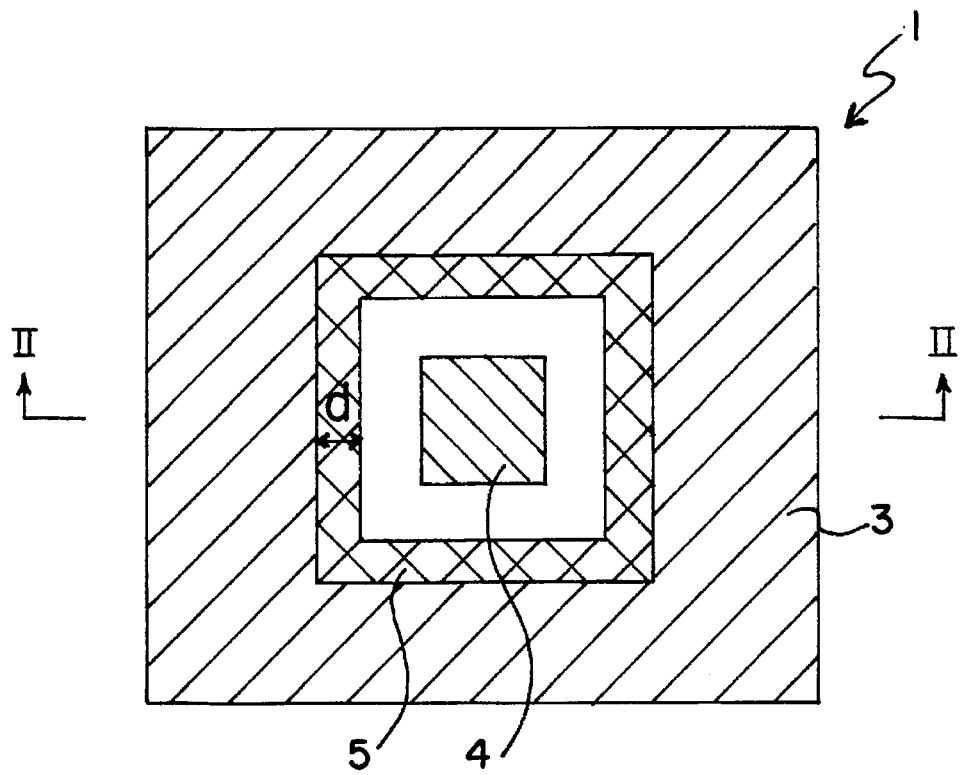
FIG. 3 is a layout of an overlay accuracy-measuring mark according to the present invention.

FIG. 3 shows a layout of a box-in-box pattern prepared by the method according to the present invention. As shown in FIG. 3, a lower film over the scribe line of a semiconductor wafer 1 is removed on the order of 20×20 μm² to form an outer box having a regular tetragon shaped while an upper film is left over the central portion of the outer box on the order of 10×10 μm² to form an inner box 4 also having a regular tetragon shape. This box-in-box structure has a groove with a width (d) which runs along the inside boundary line of the outer box.

Referring now to FIGS. 4A through 4F, a method is illustrated for the preparation of overlay accuracy-measuring mark according to the present invention.

Figure 4A:
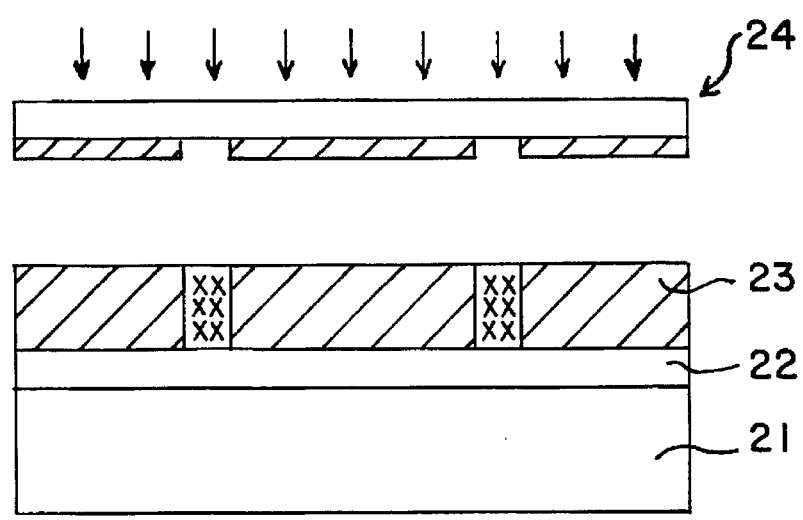
FIGS. 4A through 4F are schematic, cross sectional views taken generally through line II—II of FIG. 3, illustrating the method of the present invention stepwise.

First, a first layer 22, for example, an inter-polyoxide film or insulating film is deposited upon a semiconductor wafer 21, which is then coated with a first positive photosensitive film 23 which itself serves as a mask when a photo etching process is carried out to form a pattern of the first layer 22. Thereafter, the first photosensitive film 23 is subjected to light-exposure by use of a first light-exposure mask 24. The mask 24 is structured to expose to light, a regular tetragon shape having a side length of 1 to 3 μm of the first photosensitive film 23 that is located inside a predetermined outer box on the scribe line as to discriminate the boundary line, so thereof, as shown in FIG. 4A. The layer 22 may be formed by a subsequent process. In this case, the first layer 22 that is deposited on the chip region of wafer should be removed.

Figure 4B:
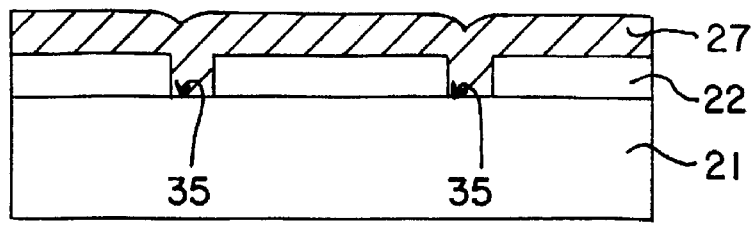

Thereafter, the light-exposed part of the first photosensitive film 23 is removed to form a pattern and an area of the first layer 22 which is exposed through the pattern is removed by a usual etching process, so as to form groove 35 along the boundary line of the outer box of regular tetragon, as shown in FIG. 4B. Then, first photosensitive film 23 is removed, followed by formation of a second layer 27, e.g. polysilicon on the entire surface of the wafer.

Figure 4C:
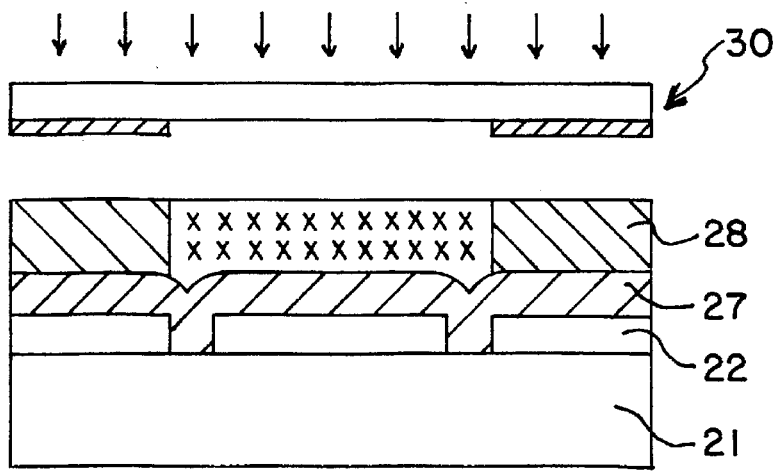

The second layer 27 is coated with a second positive photosensitive film 28 which is then exposed to light by use of a second light-exposure mask 30, as shown in FIG. 4C. The second light-exposure mask, 30, is structured to expose a predetermined area of the second layer 27 in which the outer mark is formed over the scribe line. As will be described later, the second photosensitive film 28 serves as a mask when a photo etching process is carried out to form a pattern of the second layer 22. The first layer and the second layer may have different etch selection ratios.

Figure 4D:
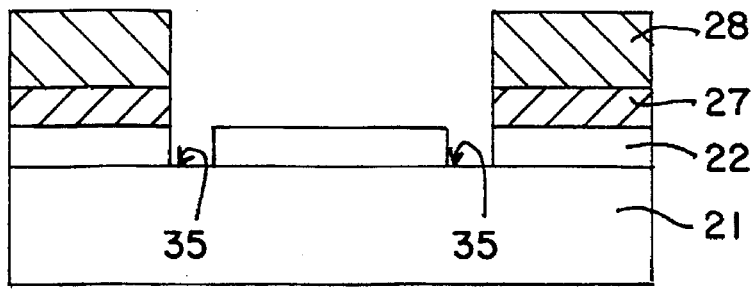

Following formation of the second photosensitive film 28, the area of the second layer 27 which is exposed to light through the second photosensitive film pattern is removed to form the outer box. The outer box has a size of 20×20 μm² with the grooves 35 and the first layer 22 therebetween being exposed, as shown in FIG. 4D. At the moment, it is noted that there are enlarged stepped parts at edge portions of the outer box owing to the grooves.

Figure 4E:
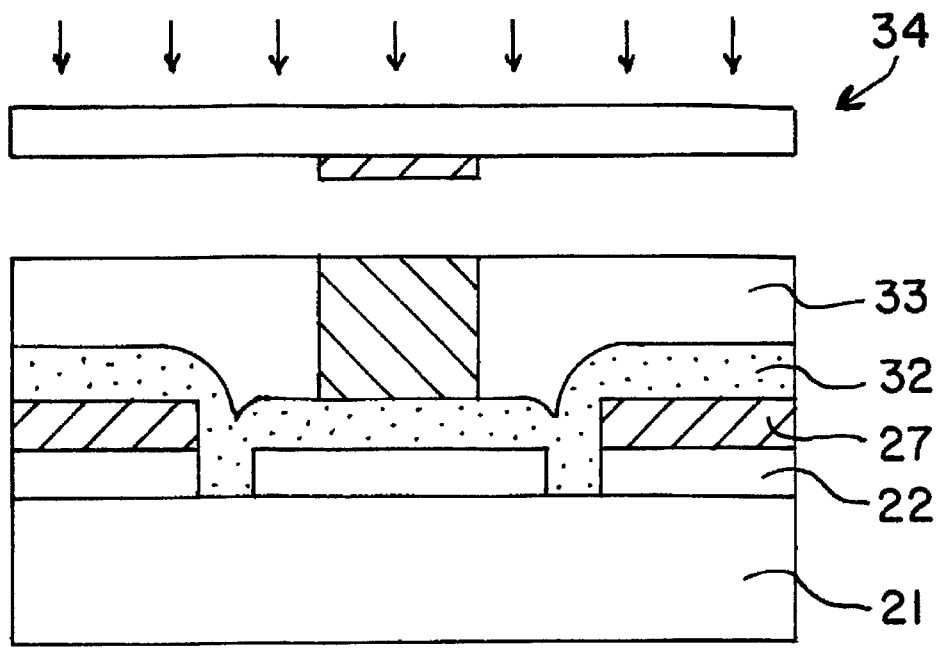
Figure 4F:
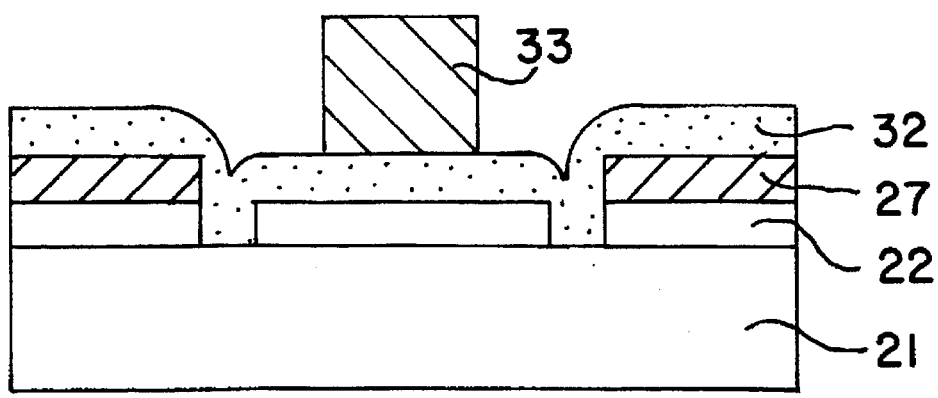

Subsequent to removal of the second photosensitive film pattern, a third layer of a metal selected from a group consisting the resulting structure, followed by formation of a third positive photosensitive film 33 which is then exposed to light by use of a third light-exposure mask 34 for the inner box, as shown in FIG. 4E. The third light-exposure mask 34, which is used to apply photo etch to the third layer 32 deposited inside the chip, is structured so as not to expose the third photosensitive film in the central area of the outer box formed over the scribe line.

Finally, the light-exposed area of the third photosensitive film 33 is removed to form a pattern measuring 10×10 μm², which is the inner box.

The resulting overlay accuracy-measuring mark has a groove which is formed along the inside edge of the outer box, and which serves as a buffer zone along which reflowing materials can flow during the course of the chip preparation.

In accordance with another aspect of the present invention, when the first light-exposure mask 24 is formed as described in FIG. 4A, the processes may be carried out after establishing a light-exposure area as predetermined by the outer box form. In this case, the first layer is completely removed inside the outer box.

In accordance with a further aspect of the present invention, while the processes for forming the groove 35 of regular tetragon may be omitted, the processes of forming the second photosensitive film pattern for the outer box mask, etching the light-exposed area of the second layer 27 and etching the light-exposed area of the first layer 26 by the etched second layer, are carried out in the stage of FIG. 4D.

In order to accurately define the boundary line of the outer mark, there is provided an enlarged stepped portion on the edge portion of the outer box through formation of a groove inside the outer mark, according to the present invention.

Alternatively, negative photosensitive films may be used for the photosensitive film patterns, instead of positive photosensitive films. In this case, the light-exposure masks are set in reverse, in order to form the overlay accuracy-measuring mark.

An overlay accuracy-measuring mark consisting of an outer box and an inner box, is prepared wherein the outer box has an increased stepped portion at its inside boundary line and a metal layer is formed over the stepped portion, whereby the boundary line can be easily defined and the overlay accuracy can be definitely measured.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for preparing a pattern overlay accuracy-measuring mark on a semiconductor wafer having a scribe line, comprising the steps of:

forming a first layer over the scribe line of said wafer;

applying photo etch to said first layer by using a first light exposure mask, to form a tetragonal frame groove in said first layer;

forming a second layer entirely on said first layer and tetragonal frame groove;

removing portions of said second layer over said first layer inside said tetragonal frame groove and over said tetragonal frame groove through photo etching by using a second light exposure mask, in order to form an outer box;

forming a metal layer entirely over said first layer, said tetragonal frame groove and said outer box;

forming a photoresist film entirely over said metal layer; and applying photo etch to said photoresist film by using a third light exposure mask so that said photoresist film is left over only a central portion of said outer box, in order to form an inner box on said metal layer.

2. The method for preparing a pattern overlay accuracy-measuring mark as set forth in claim 1, wherein said first layer and said second layer have different etch selection ratios.

3. The method for preparing a pattern overlay accuracy-measuring mark as set forth in claim 2, wherein said first layer is formed of an insulating material.

4. The method for preparing a pattern overlay accuracy-measuring mark as set forth in claim 2, wherein said second layer is formed of polysilicon.

5. The method for preparing a pattern overlay accuracy measuring mark as set forth in claim 1, wherein said metal layer is formed of tungsten or Al—Cu—Si alloy.

6. The method for preparing a pattern overlay accuracy measuring mark as set forth in claim 1, wherein said tetragonal frame groove has a width of 1 to 3 µm.

* * * * *